United States Patent
Okamoto et al.

(10) Patent No.: US 10,181,517 B2
(45) Date of Patent: Jan. 15, 2019

(54) SILICON CARBIDE SINGLE CRYSTAL, SILICON CARBIDE SINGLE CRYSTAL WAFER, SILICON CARBIDE SINGLE CRYSTAL EPITAXIAL WAFER, AND ELECTRONIC DEVICE

(71) Applicant: DENSO CORPORATION, Kariya, Aichi-pref. (JP)

(72) Inventors: Takeshi Okamoto, Kariya (JP); Hiroyuki Kondo, Kariya (JP); Takashi Kanemura, Kariya (JP); Shinichiro Miyahara, Kariya (JP); Yasuhiro Ebihara, Kariya (JP); Shoichi Onda, Kariya (JP); Hidekazu Tsuchida, Yokosuka (JP); Isaho Kamata, Yokosuka (JP); Ryohei Tanuma, Yokosuka (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/748,274

(22) PCT Filed: Aug. 25, 2016

(86) PCT No.: PCT/JP2016/074724
§ 371 (c)(1),
(2) Date: Jan. 29, 2018

(87) PCT Pub. No.: WO2017/038591
PCT Pub. Date: Mar. 9, 2017

(65) Prior Publication Data
US 2018/0219069 A1    Aug. 2, 2018

(30) Foreign Application Priority Data

Aug. 31, 2015 (JP) .................. 2015-170814

(51) Int. Cl.
*C23C 16/32* (2006.01)
*C30B 29/36* (2006.01)
(Continued)

(52) U.S. Cl.
CPC .......... *H01L 29/1608* (2013.01); *C30B 29/36* (2013.01); *H01L 21/02378* (2013.01);
(Continued)

(58) Field of Classification Search
CPC ... C30B 25/18; C30B 29/36; H01L 21/02378; H01L 21/02433; H01L 21/02529;
(Continued)

(56) References Cited

U.S. PATENT DOCUMENTS

8,831,910 B2 *  9/2014  Shintani .................. G01B 11/22
                                                           438/14
2003/0070611 A1  4/2003  Nakamura et al.
(Continued)

*Primary Examiner* — Eric A. Ward
(74) *Attorney, Agent, or Firm* — Posz Law Group, PLC (57) ABSTRACT

A silicon carbide single crystal includes: threading dislocations each of which having a dislocation line extending through a C-plane, and a Burgers vector including at least a component in a C-axis direction. In addition, a density of the threading dislocations having angles, each of which is formed by an orientation of the Burgers vector and an orientation of the dislocation line, larger than 0° and within 40° is set to 300 dislocations/cm² or less. Furthermore, a density of the threading dislocations having the angles larger than 40° is set to 30 dislocations/cm² or less.

13 Claims, 4 Drawing Sheets

(51) Int. Cl.
    *H01L 29/04*     (2006.01)
    *H01L 29/16*     (2006.01)
    *H01L 21/02*     (2006.01)
    *H01L 29/32*     (2006.01)
    *H01L 29/66*     (2006.01)
    *H01L 29/94*     (2006.01)
    *C30B 25/18*     (2006.01)

(52) U.S. Cl.
    CPC .. *H01L 21/02433* (2013.01); *H01L 21/02529* (2013.01); *H01L 21/02609* (2013.01); *H01L 21/02634* (2013.01); *H01L 29/045* (2013.01); *H01L 29/32* (2013.01); *H01L 29/6606* (2013.01); *H01L 29/94* (2013.01); *C30B 25/18* (2013.01)

(58) Field of Classification Search
    CPC ......... H01L 21/02609; H01L 21/02634; H01L 29/045; H01L 29/1608; H01L 29/32; H01L 29/6606; H01L 29/94
    See application file for complete search history.

(56) References Cited

U.S. PATENT DOCUMENTS

| | | |
|---|---|---|
| 2006/0073707 A1 | 4/2006 | Powell et al. |
| 2008/0169476 A1 | 7/2008 | Powell et al. |
| 2010/0200866 A1 | 8/2010 | Kitou et al. |
| 2013/0071643 A1 | 3/2013 | Harada et al. |
| 2013/0161651 A1 | 6/2013 | Powell et al. |
| 2015/0361586 A1 | 12/2015 | Kondo et al. |
| 2016/0108553 A1 | 4/2016 | Harada et al. |
| 2016/0215414 A1* | 7/2016 | Nakabayashi .......... C30B 23/06 |

\* cited by examiner

SILICON CARBIDE SINGLE CRYSTAL, SILICON CARBIDE SINGLE CRYSTAL WAFER, SILICON CARBIDE SINGLE CRYSTAL EPITAXIAL WAFER, AND ELECTRONIC DEVICE

CROSS REFERENCE TO RELATED APPLICATIONS

This application is a U.S. national phase of International Application No. PCT/JP2016/074724 filed on Aug. 25, 2016 and is based on Japanese Patent Application No. 2015-170814 filed on Aug. 31, 2015, the disclosures of which are incorporated herein by reference.

TECHNICAL FIELD

The present disclosure relates to a silicon carbide (hereinafter referred to as SiC) single crystal, a SiC single crystal wafer, a SiC single crystal epitaxial wafer, and an electronic device.

BACKGROUND ART

Patent Literature 1 describes a high-quality SiC single crystal. The SiC single crystal in Patent Literature 1 is required to classify spiral dislocations into dislocations with large distortion and dislocations with small distortion based only on a Burgers vector, and to have a low density of the dislocations with large distortion.

PRIOR ART LITERATURES

Patent Literature

Patent Literature 1: JP 2014-159351 A

SUMMARY OF INVENTION

According to an investigation on the relationship between device characteristics and threading dislocations by the present inventors, threading dislocations that exist in a SiC single crystal include dislocations with a large angle made between an orientation of a Burgers vector and an orientation of a dislocation line. The present inventors have found that a large number of dislocations with such a large angle existing in the SiC single crystal would lead to significant deterioration of device characteristics.

An object of the present disclosure is to provide a high-quality SiC single crystal, SiC single crystal wafer, and SiC single crystal epitaxial wafer that can improve device characteristics. Another object of the present disclosure is to provide an electronic device having improved device characteristics.

A silicon carbide single crystal according to a first aspect of the present disclosure includes threading dislocations each of which having a dislocation line extending through a C-plane and a Burgers vector including at least a component in a C-axis direction. In addition, a density of the threading dislocations having angles, each of which is formed by an orientation of the Burgers vector and an orientation of the dislocation line, larger than 0° and within 40° is set to 300 dislocations/cm$^2$ or less. Furthermore, a density of the threading dislocations having the angles larger than 40° is set to 30 dislocations/cm$^2$ or less.

Device characteristics can be improved in such a manner that an electronic device includes a silicon carbide single crystal having a low density of threading dislocations with large distortion due to a large angle made between an orientation of a Burgers vector and an orientation of a dislocation line. Accordingly, a high-quality silicon carbide single crystal can be provided.

A silicon carbide single crystal wafer according to a second aspect of the present disclosure includes threading dislocations each of which having a dislocation line extending through a C-plane and a Burgers vector including at least a component in a C-axis direction. In addition, a density of the threading dislocations having angles, each of which is formed by an orientation of the Burgers vector and an orientation of the dislocation line, larger than 0° and within 40° is set to 300 dislocations/cm$^2$ or less. Furthermore, a density of the threading dislocations having the angles larger than 40° is set to 30 dislocations/cm$^2$ or less.

Device characteristics can be improved in such a manner that an electronic device is manufactured using a silicon carbide single crystal wafer having a low density of threading dislocations with large distortion. Accordingly, a high-quality silicon carbide single crystal wafer can be provided.

A silicon carbide single crystal epitaxial wafer according to a third aspect of the present disclosure includes: a silicon carbide single crystal substrate; and an epitaxial growth layer arranged at the silicon carbide single crystal substrate. Additionally, each of the silicon carbide single crystal substrate and the epitaxial growth layer includes threading dislocations, and each of the threading dislocations has a dislocation line extending through a C-plane and a Burgers vector including at least a component in a C-axis direction. Moreover, a density of the threading dislocations having angles, each of which is formed by an orientation of the Burgers vector and an orientation of the dislocation line, larger than 0° and within 40° is set to 300 dislocations/cm$^2$ or less, and a density of the threading dislocations having the angles larger than 40° is set to 30 dislocations/cm$^2$ or less.

Device characteristics can be improved in such a manner that an electronic device is manufactured using a silicon carbide single crystal epitaxial wafer having a low density of threading dislocations with large distortion. Accordingly, a high-quality silicon carbide single crystal epitaxial wafer can be provided.

An electronic device according to a fourth aspect of the present disclosure includes: a silicon carbide single crystal substrate including having dislocations. Each of the threading dislocations has a dislocation line extending through a C-plane and a Burgers vector including at least a component in a C-axis direction. In addition, a density of the threading dislocations of the silicon carbide single crystal substrate having angles, each of which is formed by an orientation of the Burgers vector and an orientation of the dislocation line, larger than 0° and within 40° is set to 300 dislocations/cm$^2$ or less, and a density of the threading dislocations of the silicon carbide single crystal substrate having the angles larger than 40° is set to 30 dislocations/cm$^2$ or less.

An electronic device according to a fifth aspect of the present disclosure includes: a silicon carbide single crystal substrate; and an epitaxial growth layer arranged at the silicon carbide single crystal substrate. In addition, each of the silicon carbide single crystal substrate and the epitaxial growth layer includes threading dislocations, and each of the threading dislocations has a dislocation line extending through a C-plane and a Burgers vector including at least a component in a C-axis direction. Moreover, a density of the threading dislocations having angles, each of which is formed by an orientation of the Burgers vector and an orientation of the dislocation line, larger than 0° and within 40°, is set to 300 dislocations/cm' or less, and a density of the threading dislocations having the angles larger than 40° is set to 30 dislocations/cm² or less.

Since the electronic device includes the silicon carbide single crystal substrate or each of the silicon carbide single crystal substrate and the epitaxial growth layer having a low density of threading dislocations with large distortion, the device characteristics can be improved, as compared to a case of a high density of threading dislocations with large distortion.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Embodiments of the present disclosure will be hereinafter described with reference to the drawings. In the following embodiments, the same elements or related elements may be denoted by the same reference numeral. In the case of indicating crystal orientation, a bar (−) should be originally attached above a desired number, but because the restricted expression is restricted based on electronic applications, the bar is attached in front of the desired number in the present specification.

(First Embodiment)

The present embodiment describes a SiC single crystal epitaxial wafer and a MOS capacitor manufactured using the SiC single crystal epitaxial wafer.

Figure 1:
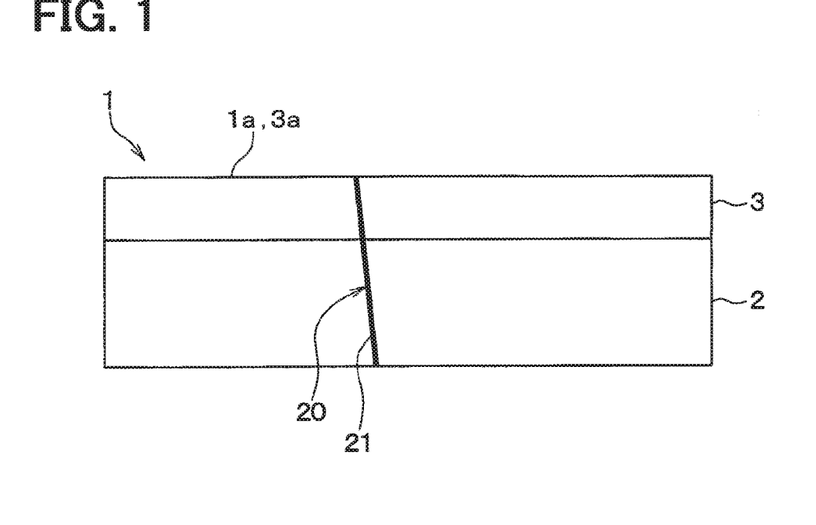
FIG. 1 is a cross-sectional view of a SiC single crystal epitaxial wafer in a first embodiment.

As illustrated in FIG. 1, a SiC single crystal epitaxial wafer 1 includes a SiC single crystal substrate 2, and a SiC epitaxial growth layer 3 formed by epitaxial growth on a surface of the SiC single crystal substrate 2. Hereinafter, the SiC single crystal epitaxial wafer 1 may also be referred to as a wafer 1, the SiC single crystal substrate 2 may also be referred to as a single crystal substrate 2, and the SiC epitaxial growth layer 3 may also be referred to as an epilayer 3. The SiC single crystal that forms the single crystal substrate 2 and the epilayer 3 has a polymorphism of 4H. An off-angle on a surface 1a of the wafer 1 (i.e., a surface 3a of the epilayer 3) is about 4° in a <11-20> direction with respect to a {0001} plane. The epilayer 3 has a N-type conductivity. The SiC single crystal may have a different polymorphism such as 6H or 3C. The off-angle on the surface 1a of the wafer 1 may be set within 10° in the <11-20> direction with respect to the {0001} plane.

The wafer 1 to be used may have a diameter of 100 mm or more, or about 150 mm or more. The wafer 1 preferably has a micropipe density of less than 1/cm², a threading edge dislocation density of less than 3000/cm², a stacking fault density of less than 0.1/cm², and an inclusion density of less than 1 cm³.

Figure 2:
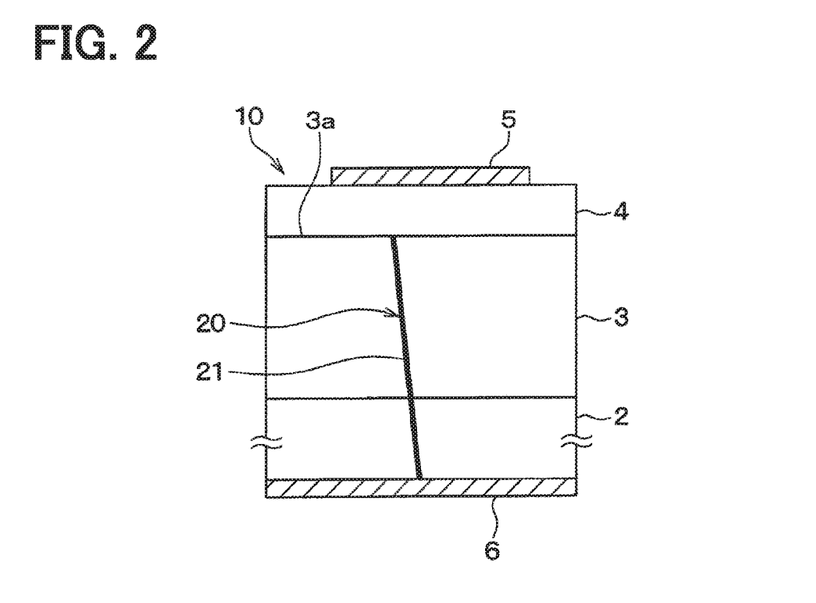
FIG. 2 is a cross-sectional view of a MOS capacitor in the first embodiment.

As illustrated in FIG. 2, a MOS capacitor 10 is formed of an electronic device that has a MOS structure. The MOS capacitor 10 includes a single crystal substrate 2, an epilayer 3 as an N-type drift layer formed on a front face of the SiC single crystal substrate 2, an oxide film 4 formed on a surface 3a of the epilayer 3, a first electrode 5 formed on a surface of the oxide film 4, and a second electrode 6 formed on a rear face of the SiC single crystal substrate 2.

The MOS capacitor 10 is manufactured by forming the oxide film 4 on the surface 1a of the wafer 1 illustrated in FIG. 1, forming the first electrode 5 on the surface of the oxide film 4, forming the second electrode 6 on the rear face of the single crystal substrate 2, and dicing the wafer 1 into a desired size. The single crystal substrate 2 and epilayer 3 of the wafer 1 correspond to the single crystal substrate 2 and epilayer 3 of the MOS capacitor 10. Thus, the "substrate" in the present specification may refer to its state before the wafer is diced, and after the wafer has been diced. The single crystal substrate 2 and epilayer 3 of the wafer 1 as well as the single crystal substrate 2 and epilayer 3 of the MOS capacitor 10 in the present embodiment each correspond to a SiC single crystal of the present invention.

As illustrated in FIGS. 1 and 2, a threading dislocation 20 exists in the single crystal substrates 2 and epilayers 3 of the wafer 1 and MOS capacitor 10. The threading dislocation 20 is a crystal defect in which atomic planes are arranged spirally around a dislocation line 21. The threading dislocation 20 has a dislocation line 21 extending through a C-plane of the SiC single crystal and a Burgers vector including at least a component in a C-axis direction.

Herein, the C-plane is a {0001} plane, and the C-axis is a <0001> axis. The Burgers vector including at least a component in a C-axis direction means a case where the Burgers vector includes only the component in the taxis direction and a case where the Burgers vector includes the component in the C-axis direction and components in other axis directions. Examples of the case where the Burgers vector includes the component in the C-axis direction and components in other axis directions include bv=a+c, bv=m+c, and bv=2a+c. In these equations, "bv" represents a Burgers vector, "a" represents a vector in a ⅓<11-20> direction, "c" represents a vector in a <0001> direction, and "m" represents a vector in a <1-100> direction.

Figure 3:
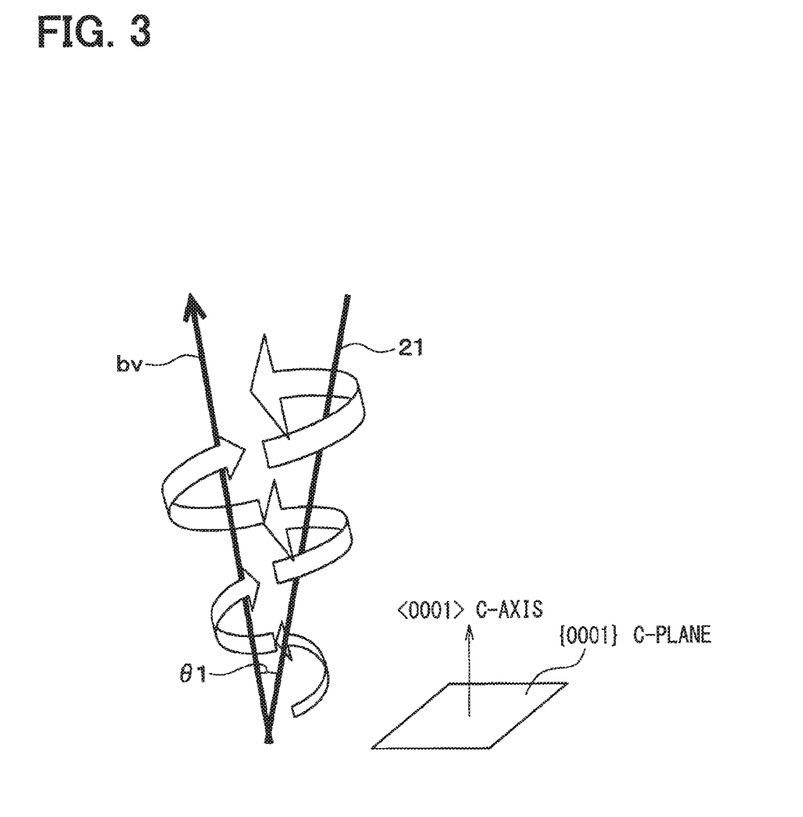
FIG. 3 is a schematic view illustrating a threading dislocation.

As illustrated in FIG. 3, moreover, in the threading dislocation 20, an orientation of the Burgers vector by is displaced from an orientation of the dislocation line 21. A larger angle $\theta 1$ to be made between the orientation of the Burgers vector by and the orientation of the dislocation line 21 causes larger distortion. The angle $\theta 1$ may be larger than 0° and smaller than 90° (0°<$\theta 1$<90°).

In the present embodiment, the single crystal substrate 2 and the epilayer 3 have a density of threading dislocations 20 whose angles $\theta 1$ each made between the orientation of the Burgers vector by and the orientation of the dislocation line are larger than 0° and within 40° (0°<$\theta 1$≤40°), the density being set to 300 dislocations/cm² or less, and a density of the threading dislocations 20 whose angles $\theta 1$ are larger than 40° ($\theta 1$ >40°), the density being set to 30 dislocations/cm² or less. Preferably, the single crystal substrate 2 and the epilayer 3 have a density of the threading dislocations 20 whose angles $\theta 1$ are within 20° (0°<$\theta 1$≤20°), the density being set to 300 dislocations/cm² or less, and a density of the threading dislocations 20 whose angles $\theta 1$ are larger than 20° ($\theta 1$ >20°), the density being set to 30 dislocations/cm² or less. More preferably, the single crystal substrate 2 and the epilayer 3 have a density of the threading dislocations 20 whose angles θ1 are within 7° (0°<θ1≤7°), the density being set to 300 dislocations/cm² or less, and a density of the threading dislocations 20 whose angles θ1 are larger than 7° (θ1 >7°), the density being set to 30 dislocations/cm² or less. The angle θ1 larger than 0° and within 40°''' refers to angles that satisfy a requirement for the angle θ1 that is larger than 0° and within 40°. The angles θ1 may not necessarily be even but may be uneven. The same applies to angles θ1 within 20° or 7°.

The Burgers vector by can be determined by a large-angle convergent-beam electron diffraction (LACBED) method. For example, when a defocused electron beam is projected to a specimen, distortion around a dislocation splits a higher-order Laue zone (HOLZ) line. The split HOLZ lines are then indexed by simulation. The Burgers vector by of the threading dislocation 20 can be determined by the analysis of the indexes of the HOLZ lines and the number of split HOLZ lines.

The orientation of the dislocation line 21 is determined by a three dimensional (3D) observation method using a transmission electron microscope (TEM). While the inclination of a dislocation in a direction perpendicular to an electron beam incident direction can be evaluated in normal TEM observation, the inclination in a parallel direction cannot be evaluated. That is, the inclination of a dislocation within a plane parallel to the electron beam incident direction cannot be evaluated. Therefore, either the electron beam incident direction or the specimen is inclined to evaluate the inclination in a direction parallel to a predetermined incident direction.

For example, an observation of an electron beam diffraction image with an incident direction oriented to a [1-100] direction enables determination of an inclination angle from a <0001> axis in a [11-20] direction. The <0001> axis direction is determined from the electron beam diffraction image. The electron beam projection direction is then rotated 180° around the <0001> axis. This changes the inclination of the dislocation to be observed. The inclination in the [1-100] direction is calculated from the amount of this change.

The orientation of the dislocation line 21 can also be determined with the use of a photoluminescence device having a confocal function (3DPL) or a Raman spectrometer having a confocal function (3D Raman).

The angle made between the Burgers vector by and the dislocation line 21 is determined by a calculation method for calculating an angle between two vectors in a spatial figure.

The density of the threading dislocations 20 can be determined by counting the number of threading dislocations 20 that exist per an area of 1 cm² in a predetermined plane of the SiC single crystal. For example, using molten salt containing KOH, the epilayer 3 is etched, and the number of threading dislocations 20 where substantially hexagonal etch pits are observed is counted with the use of a TEM or an optical microscope. A plane inclined at an angle of not more than 10° from the C-plane is used as the plane to be observed. The area to be observed has a size of 1 cm×1 cm. The area to be observed may have a size of 1 cm×1 cm or larger or a size of less than 1 cm×1 cm. If the area to be observed is not large enough, the dislocation density cannot be evaluated correctly. The area to be observed therefore preferably has the size of 1 cm×1 cm or larger.

Figure 4:
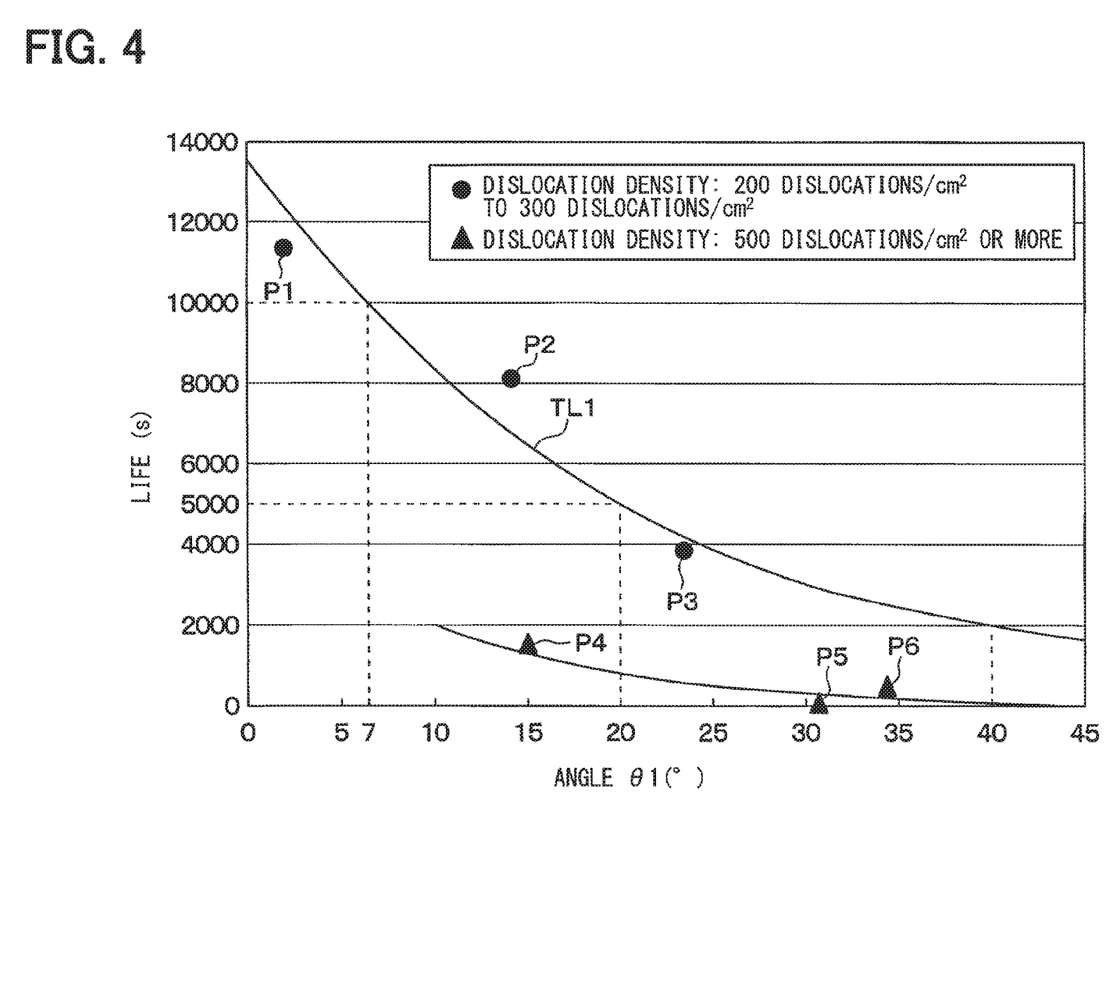
FIG. 4 is a graph showing a relationship between an angle made between a Burgers vector and a dislocation line of a threading dislocation, and the life of a MOS capacitor.

FIG. 4 shows the results of experiment conducted by the present inventors about the relationship between the life of the MOS capacitor 10 mentioned above and the angle θ1 between the Burgers vector by and the dislocation line 21 of the threading dislocations 20 that exist in the single crystal substrate 2 and the epilayer 3.

As indicated by points P1 to P6 in FIG. 4, this experiment employed wafers 1 having predetermined densities of threading dislocations 20 whose angles θ1 are a predetermined angle or less. The wafers 1 used in the experiment and represented by the points P1, P2, and P3 each had a density of threading dislocations whose angles exceed the angle of each point, the density being 30 dislocations/cm² or less. For example, the wafer 1 represented by the point P3 had a density of threading dislocations 20 whose angles are larger than the angle at the point P3, the density being 30 dislocations/cm² or less. An approximate curve TL1 of the points P1, P2, and P3 in FIG. 4 was determined by exponential approximation with a least-square method.

The Burgers vector by of the threading dislocations 20 in the wafers 1 represented by the points P1, P2, P4, P5, and P6 in FIG. 4 was a+c. The Burgers vector by of the threading dislocations 20 in the wafer 1 represented by point P3 was m+c. The wafers 1 used herein were manufactured according to a method described in Japanese Patent No. 3,745,668. The wafers 1 used herein each had a surface 1a with an off-angle set to about 4° in a <11-20> direction with respect to a {0001} plane. The threading dislocations 20 whose density was measured were those that had reached the surface 1a.

To measure the life of the MOS capacitors 10, a constant voltage was applied reversely to the MOS capacitors 10, and the time until the leak current increases to a predetermined level was measured.

The results of experiment shown in FIG. 4 indicated that, to manufacture high-quality devices with a life of 2000 seconds or more, the density of the threading dislocations 20 whose angles θ1 are larger than 0° and within 40° is reduced to 300 dislocations/cm² or less, and the density of the threading dislocations 20 whose angles θ1 are larger than 40° is reduced to 30 dislocations/cm² or less. The results of experiment shown in FIG. 4 also indicated that, to manufacture high-quality devices with a life of 5000 seconds or more, the density of the threading dislocations 20 whose angles θ1 are larger than 0° and within 20° is reduced to 300 dislocations/cm² or less, and the density of the threading dislocations 20 whose angles θ1 are larger than 20° is reduced to 30 dislocations/cm² or less. The results of experiment shown in FIG. 4 also indicated that, to manufacture high-quality devices with a life of 10000 seconds or more, the density of the threading dislocations 20 whose angle θ1 are larger than 0° and within 7° is reduced to 300 dislocations/cm² or less, and the density of the threading dislocations 20 whose angles θ1 are larger than 7° is reduced to 30 dislocations/cm² or less.

FIG. 4 shows the results of experiment on the threading dislocations which are exist in the wafers 1 and whose angles θ1 are within specified values. One can assume from the results of this experiment that, even if the angles θ1 are uneven, it is possible to manufacture high-quality devices with a life of 2000 seconds or more as long as the angle θ1 is smaller than 40°.

As described above, the wafer 1 of the present embodiment has the density of the threading dislocations 20 which exist in the single crystal substrate 2 and the epilayer 3 and whose angles θ1 each made between the orientation of the Burgers vector by and the orientation of the dislocation line 21 are larger than 0° and within 40°, the density being set to 300 dislocations/cm² or less, and the density of the threading dislocations 20 whose angles θ1 are larger than 40°, the density being set to 30 dislocations/cm² or less. Preferably, the wafer 1 of the present embodiment has the density of the threading dislocations 20 whose angles θ1 are within 20°, the density being set to 300 dislocations/cm² or less, and the density of the threading dislocations 20 whose angles θ1 are larger than 20°, the density being set to 30 dislocations/cm² or less. More preferably, the wafer 1 of the present embodiment has the density of the threading dislocations 20 whose angles θ1 are within 7°, the density being set to 300 dislocations/cm² or less, and the density of the threading dislocations 20 whose angles θ1 are larger than 7°, the density being set to 30 dislocations/cm² or less.

As described above, the wafer 1 of the present embodiment has a low density of threading dislocations with large distortion. Therefore, by manufacturing MOS capacitors 10 using the wafer 1 of the present embodiment, the life of the MOS capacitors 10 can be made longer.

The MOS capacitor 10 of the present embodiment has the density of the threading dislocations 20 which exist in the single crystal substrate 2 and the epilayer 3 and whose angles θ1 each made between the orientation of the Burgers vector by and the orientation of the dislocation line 21 are larger than 0° and within 40°, the density being set to 300 dislocations/cm² or less, and the density of the threading dislocations 20 whose angles θ1 are larger than 40°, the density being set to 30 dislocations/cm² or less. Preferably, the MOS capacitor 10 has the density of the threading dislocations 20 whose angles θ1 are within 20°, the density being set to 300 dislocations/cm² or less, and the density of the threading dislocations 20 whose angles θ1 are larger than 20°, the density being set to 30 dislocations/cm² or less. More preferably, the MOS capacitor 10 has the density of the threading dislocations 20 whose angles θ1 are within 7°, the density being set to 300 dislocations/cm² or less, and the density of the threading dislocations 20 whose angles θ1 are larger than 7°, the density being set to 30 dislocations/cm² or less.

As described above, the single crystal substrate 2 and the epilayer that constitute the MOS capacitor 10 have a low density of threading dislocations with large distortion. Therefore, the life of the MOS capacitor 10 can be made longer as compared to when the MOS capacitor has a high density of threading dislocations with large distortion. Namely, the device characteristics of the electronic device can be improved.

In the present embodiment, the surface 3a of the epilayer 3 in the wafer 1 and the MOS capacitor 10 has an off-angle set within 10° in the <11-20> direction with respect to the {0001} plane. The angle θ1 and the density of the threading dislocations 20 that reach this surface 3a are specified. This is because the influence of threading dislocations 20 with large distortion on device characteristics is considered to be particularly large when the threading dislocations 20 exist near the surface 3a of the epilayer 3. However, it is considered that the threading dislocations 20 with large distortion will adversely affect the device characteristics not only when the threading dislocations 20 exist near the surface 3a of the epilayer 3 but also when they exist in other portions than near the surface 3a of the epilayer 3. Therefore, the threading dislocations 20 whose angles θ1 and density are to be specified are not limited to those that exist in the epilayer 3 such as to reach the surface 3a.

While the wafers 1 of the present embodiment is manufactured according to the method described in Japanese Patent No. 3,745,668, the wafers may be manufactured according to other methods.

(Other Embodiments)

The present disclosure is not limited to the embodiments described above and can be changed as required without departing from the scope of the subject matter of the present disclosure as will be described below.

(1) In the first embodiment, the MOS capacitors 10 are one example of an electronic device manufactured using the SiC single crystal, and the life of the MOS capacitors 10 is examined. It is assumed that the results will be similar to FIG. 4 with respect to the life of other electronic devices. Other electronic devices include those that have a MOS structure other than MOS capacitors, and electronic devices that have diodes. An electronic device that has a MOS structure includes a first electrode 5 on a SiC single crystal via an oxide film 4, similarly to the MOS capacitor 10. A MOSFET including a first electrode 5 as a gate electrode is one example of the electronic device that has the MOS structure. Examples of electronic devices having diodes include Schottky diodes and PN diodes. A Schottky diode can be formed, for example, by omitting the oxide film 4 from the structure illustrated in FIG. 2, i.e., forming the first electrode 5 on the surface 3a of the epilayer 3 so that the first electrode 5 makes Schottky contact with the epilayer 3. In FIG. 2, a PN diode can be formed if a P-type layer is formed as a surface layer of the epilayer 3 so that the first electrode 5 makes ohmic contact with the P-type layer.

(2) In the first embodiment, the electronic device is manufactured using the SiC single crystal epitaxial wafer 1. Instead, the electronic device may be manufactured using a SiC single crystal wafer 101 illustrated in FIG. 5. This SiC single crystal wafer 101 is made of SiC single crystal in a substrate form, and does not include an epitaxial growth layer. Namely, the SiC single crystal wafer 101 is formed only of the single crystal substrate 2, of the single crystal substrate 2 and the epilayer 3 of the wafer 1 of the first embodiment.

Figure 5:
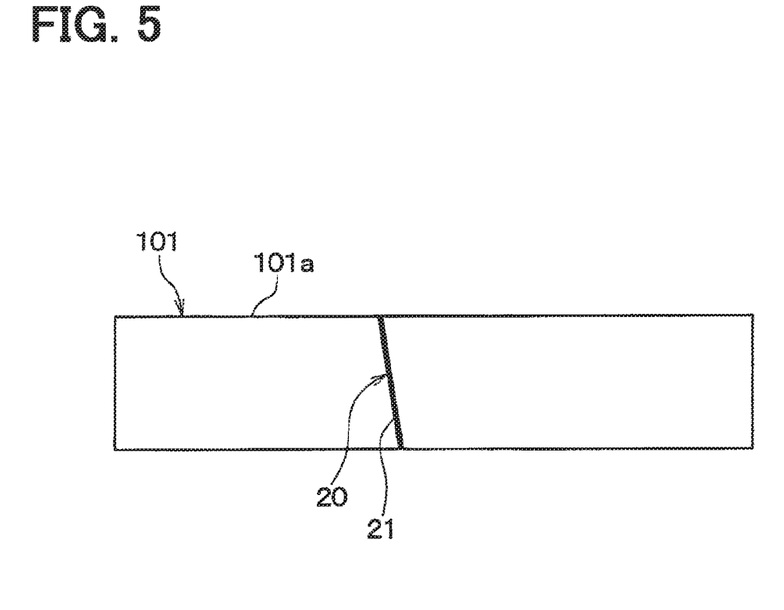
FIG. 5 is a cross-sectional view of a SiC single crystal wafer in another embodiment.

The SiC single crystal wafer 101 has a low density of threading dislocations with large distortion similarly to the single crystal substrate 2 of the wafer 1 of the first embodiment. Therefore, by manufacturing an electronic device using the SiC single crystal wafer 101, the life of the electronic device can be made longer similarly to the first embodiment.

Preferably, a surface 101a of this SiC single crystal wafer 101 has an off-angle set within 10° in the <11-20> direction with respect to the {0001} plane, with the angle and the density being specified similarly to the first embodiment with respect to the threading dislocations 20 that reach this surface 101a.

The electronic device to be manufactured may have not only a structure that includes the SiC single crystal substrate and SiC epitaxial growth layer, but also a structure that includes the SiC single crystal substrate but does not include the epitaxial growth layer. Examples of an electronic device with a structure that does not include an epitaxial growth layer include the MOS capacitor 10 illustrated in FIG. 2 without the epilayer 3, and instead having a single crystal substrate 2 that constitutes the part corresponding to the epilayer 3. In this case, the surface of the single crystal substrate 2 corresponds to the surface 101a of the SiC single crystal wafer 101.

(3) The embodiments described above are not irrelevant to each other and can be combined as required except when the combination is obviously impossible. As will be understood, the elements constituting the embodiments described above are not necessarily essential unless explicitly specified as essential and unless considered clearly essential in theory.

The invention claimed is:

1. A silicon carbide single crystal comprising:
   threading dislocations each of which having
      a dislocation line extending through a C-plane, and
      a Burgers vector including at least a component in a C-axis direction,
   wherein a density of the threading dislocations having angles, each of which is formed by an orientation of the Burgers vector and an orientation of the dislocation line, larger than 0° and within 40° is set to 300 dislocations/cm$^2$ or less, and
   wherein a density of the threading dislocations having the angles larger than 40° is set to 30 dislocations/cm$^2$ or less.

2. The silicon carbide single crystal according to claim 1,
   wherein a density of the threading dislocations having the angles within 20° is set to 300 dislocations/cm$^2$ or less, and
   wherein a density of the threading dislocations having the angles larger than 20° is set to 30 dislocations/cm$^2$ or less.

3. The silicon carbide single crystal according to claim 1,
   wherein a density of the threading dislocations having the angles within 7° is set to 300 dislocations/cm$^2$ or less, and
   wherein a density of the threading dislocations having the angles larger than 7° is set to 30 dislocations/cm$^2$ or less.

4. A silicon carbide single crystal wafer comprising:
   threading dislocations each of which having
      a dislocation line extending through a C-plane, and
      a Burgers vector including at least a component in a C-axis direction,
   wherein a density of the threading dislocations having angles, each of which is formed by an orientation of the Burgers vector and an orientation of the dislocation line, larger than 0° and within 40° is set to 300 dislocations/cm$^2$ or less, and
   wherein a density of the threading dislocations having the angles larger than 40° is set to 30 dislocations/cm$^2$ or less.

5. The silicon carbide single crystal wafer according to claim 4,
   wherein a density of the threading dislocations having the angles within 20° is set to 300 dislocations/cm$^2$ or less, and
   wherein a density of the threading dislocations having the angles larger than 20° is set to 30 dislocations/cm$^2$ or less.

6. The silicon carbide single crystal wafer according to claim 4,
   wherein a density of the threading dislocations having the angles within 7° is set to 300 dislocations/cm$^2$ or less, and
   wherein a density of the threading dislocations having the angles larger than 7° is set to 30 dislocations/cm$^2$ or less.

7. A silicon carbide single crystal epitaxial wafer comprising:
   a silicon carbide single crystal substrate; and
   an epitaxial growth layer arranged at the silicon carbide single crystal substrate,
   wherein each of the silicon carbide single crystal substrate and the epitaxial growth layer includes threading dislocations, and each of the threading dislocations has
      a dislocation line extending through a C-plane, and
      a Burgers vector including at least a component in a C-axis direction,
   wherein a density of the threading dislocations having angles, each of which is formed by an orientation of the Burgers vector and an orientation of the dislocation line, larger than 0° and within 40° is set to 300 dislocations/cm$^2$ or less, and
   wherein a density of the threading dislocations having the angles larger than 40° is set to 30 dislocations/cm$^2$ or less.

8. The silicon carbide single crystal epitaxial wafer according to claim 7,
   wherein a density of the threading dislocations having the angles within 20° is set to 300 dislocations/cm$^2$ or less, and
   wherein a density of the threading dislocations having the angles larger than 20° is set to 30 dislocations/cm$^2$ or less.

9. The silicon carbide single crystal epitaxial wafer according to claim 7,
   wherein a density of the threading dislocations having the angles within 7° is set to 300 dislocations/cm$^2$ or less, and
   wherein a density of the threading dislocations having the angles larger than 7° is set to 30 dislocations/cm$^2$ or less.

10. An electronic device comprising:
    a silicon carbide single crystal substrate including threading dislocations, each of the threading dislocations having
       a dislocation line extending through a C-plane, and
       a Burgers vector including at least a component in a C-axis direction,
    wherein a density of the threading dislocations of the silicon carbide single crystal substrate having angles, each of which is formed by an orientation of the Burgers vector and an orientation of the dislocation line, larger than 0° and within 40° is set to 300 dislocations/cm$^2$ or less, and
    wherein a density of the threading dislocations of the silicon carbide single crystal substrate having the angles larger than 40° is set to 30 dislocations/cm$^2$ or less.

11. An electronic device comprising:
    a silicon carbide single crystal substrate; and
    an epitaxial growth layer arranged at the silicon carbide single crystal substrate,
    wherein each of the silicon carbide single crystal substrate and the epitaxial growth layer includes threading dislocations, and each of the threading dislocations has
       a dislocation line extending through a C-plane, and
       a Burgers vector including at least a component in a C-axis direction,
    wherein a density of the threading dislocations having angles, each of which is formed by an orientation of the Burgers vector and an orientation of the dislocation line, larger than 0° and within 40°, is set to 300 dislocations/cm$^2$ or less, and
    wherein a density of the threading dislocations having the angles larger than 40° is set to 30 dislocations/cm$^2$ or less.

12. The electronic device according to claim 10,
    wherein a density of the threading dislocations having the angles are within 20° is set to 300 dislocations/cm$^2$ or less, and wherein a density of the threading dislocations having the angles larger than 20° is set to 30 dislocations/cm$^2$ or less.

13. The electronic device according to claim 10,
wherein a density of the threading dislocations having the angles are within 7° is set to 300 dislocations/cm$^2$ or less, and
wherein a density of the threading dislocations having the angles are larger than 7° is set to 30 dislocations/cm$^2$ or less.

* * * * *